(12) United States Patent
Hartlieb et al.

(10) Patent No.: US 8,994,563 B2
(45) Date of Patent: Mar. 31, 2015

(54) SIGNAL CONVERTER AND METHOD FOR OPERATING A SIGNAL CONVERTER

(71) Applicant: Infineon Technologies AG, Neubiberg (DE)

(72) Inventors: Heimo Hartlieb, Graz (AT); Clemens Kain, Kammern (AT); Michael Hausmann, Gleisdorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/968,036

(22) Filed: Aug. 15, 2013

(65) Prior Publication Data

US 2015/0048958 A1 Feb. 19, 2015

(51) Int. Cl.
*H03M 1/00* (2006.01)
*H03M 1/34* (2006.01)
*H03M 1/12* (2006.01)

(52) U.S. Cl.
CPC ............ *H03M 1/34* (2013.01); *H03M 1/001* (2013.01); *H03M 1/124* (2013.01); *H03M 2201/4135* (2013.01); *H03M 1/00* (2013.01); *H03M 1/12* (2013.01)

USPC ............................................ 341/110; 341/139

(58) Field of Classification Search
CPC .. H03M 1/00; H03M 2201/4135; H03M 1/12
USPC .......................... 341/110, 132, 139, 155, 156
See application file for complete search history.

(56) References Cited

U.S. PATENT DOCUMENTS 4,827,191 A * 5/1989 Chapman ...................... 341/132

* cited by examiner

*Primary Examiner* — Joseph Lauture
(74) *Attorney, Agent, or Firm* — Slater & Matsil, L.L.P.

(57) ABSTRACT

In accordance with an embodiment, a method for operating a signal converter includes converting an analog input signal to a digital output signal, comprising by comparing the analog input signal to an analog comparison signal, and detecting whether the analog input signal exceeds a predetermined maximum or minimum threshold by comparing the analog input signal to an analog threshold signal. The analog comparison signal and the analog threshold signal are generated by a same digital-to-analog converter.

18 Claims, 6 Drawing Sheets

SIGNAL CONVERTER AND METHOD FOR OPERATING A SIGNAL CONVERTER

TECHNICAL FIELD

The invention relates to a signal converter, a method for operating a signal converter, and an electronic device.

BACKGROUND

Conventional microcontroller or microprocessor systems, e.g., systems that are used in the automotive field, frequently comprise one or a plurality of signal converters, e.g., respective analog-to-digital converters.

By means of an analog-to-digital converter, an analog input signal, e.g., a corresponding measurement voltage may be converted to a digital numerical value that is "understandable" for the corresponding microcontroller or microprocessor. Analog-to-digital converters may operate in accordance with a plurality of different converting methods, e.g., the parallel method, or the successive approximation method, etc. In some cases, analog-to-digital converters are operated as fast as possible, so that a respective digital numerical output value is available as soon as possible.

In addition to one or several of the above analog-to-digital converters, conventional microcontroller or microprocessor systems often comprise one or several over-voltage-detectors. Such detectors, e.g., may include a comparator to detect whether an analog input voltage exceeds a first predetermined value, in which case, e.g., an alarm signal is generated. The predetermined value e.g. may be stored in digital form in a respective register, and a respective digital-to-analog converter (DAC) may be used to convert the respective digital numerical value into an analog signal to be compared by the above comparator to the input voltage.

However, when a microcontroller or microprocessor system includes both one or several over-voltage-detectors, and one or several analog-to-digital converters, in total, a relatively high number of elements (comparators, DACs, etc.) to build these devices may be used.

SUMMARY OF THE INVENTION

In accordance with an embodiment, a method for operating a signal converter includes converting an analog input signal to a digital output signal, comprising by comparing the analog input signal to an analog comparison signal, and detecting whether the analog input signal exceeds a predetermined maximum or minimum threshold by comparing the analog input signal to an analog threshold signal. The analog comparison signal and the analog threshold signal are generated by a same digital-to-analog converter.

According to a further embodiment, a signal converter includes one or more comparators configured to compare an analog input signal to an analog comparison signal for an analog-to-digital conversion of the analog input signal. The one or more comparators are further configured to compare the analog input signal to an analog threshold signal to detect whether the analog input signal exceeds a predetermined maximum or minimum threshold. The signal converter further includes a digital-to-analog converter configured to generate both the analog comparison signal and the analog threshold signal.

According to an additional embodiment, an electronic device includes means for comparing an analog input signal to an analog comparison signal for an analog-to-digital conversion of the analog input signal, means for comparing the analog input signal to an analog threshold signal for a detection of whether the analog input signal exceeds a predetermined maximum or minimum threshold, and means for generating both the analog comparison signal and the analog threshold signal.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated, as they become better understood by reference to the following detailed description.

Figure 1:
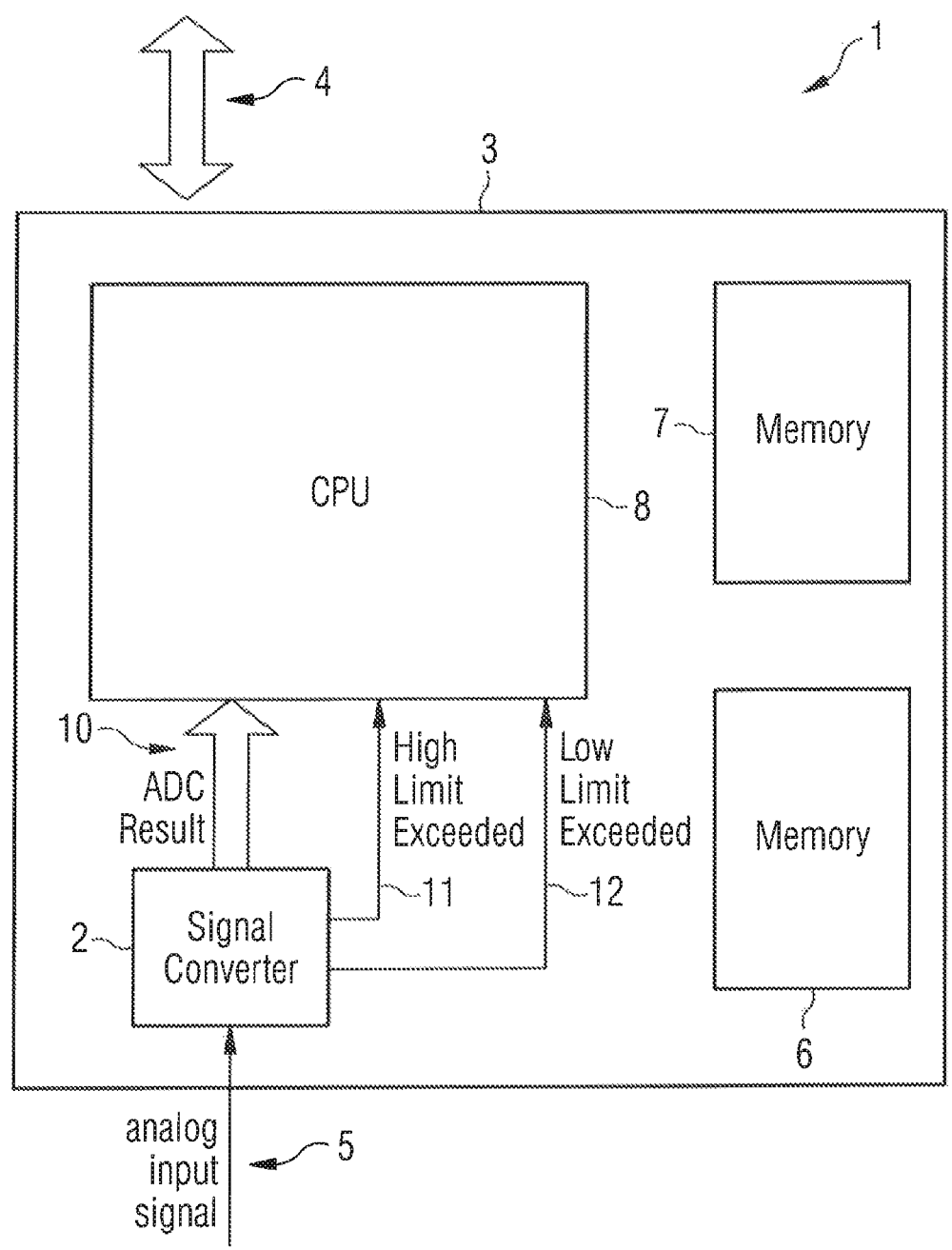
FIG. 1 depicts a schematic structure of an exemplifying electronic system in which a signal converter according to an embodiment of the invention may be employed.

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. The following detailed description, therefore, is not to be taken in a limiting sense, and the scope of the present invention is defined by the appended claims.

DETAILED DESCRIPTION OF ILLUSTRATIVE EMBODIMENTS

Microcontroller or microprocessor systems, e.g., systems that are used in the automotive field, may comprise one or a plurality of signal converters, e.g., respective analog-to-digital converters.

By means of an analog-to-digital converter, an analog input signal, e.g., a corresponding measurement voltage may be converted to a digital numerical value that is "understandable" for the corresponding microcontroller or microprocessor.

Analog-to-digital converters may operate in accordance with a plurality of different converting methods, e.g., the parallel method, or the successive approximation method, etc.

In the case of the parallel method, an analog input signal is, by means of n corresponding comparators, simultaneously compared with n different reference voltages, and it is determined between which two reference voltages the input signal ranges. This way, the digital numerical value pertaining to the input signal may be detected in one single step.

However, for the parallel method, a relatively high number of comparators are needed. In contrast, an analog-to-digital converter working according to the successive approximation method uses one single comparator, only.

By use of the comparator, a range that comprises the input voltage, i.e., the measuring range is successively narrowed in a plurality of steps. For example, in a first step, the input voltage is compared by the comparator to the midpoint (e.g., 8 V) of the range (e.g., 0-16 V). If the comparator, e.g., detects that the input voltage is smaller than 8 V, the range is narrowed to 0-8 V.

In a second step, the input voltage is compared by the comparator to the midpoint (e.g., 4 V) of the narrowed range. If the comparator, e.g., detects that the input voltage is higher than 4 V, the range is further narrowed to 4-8 V.

In a third step, the input voltage is compared by the comparator to the midpoint (e.g., 6 V) of the further narrowed range. If the comparator e.g. detects that the input voltage is higher than 6 V, the range is further narrowed to 6-8 V. These steps are continued until the desired resolution is reached.

Hence, other than with the parallel analog-to-digital conversion method, for the successive approximation analog-to-digital conversion method, only one single comparator is necessary in some embodiments.

In addition to one or several of the above analog-to-digital converters, a microcontroller or microprocessor system may comprise one or several over-voltage-detectors. Such detectors, e.g., may comprise a comparator to detect that an analog input voltage exceeds a first predetermined value, in which case, e.g., an alarm signal is generated.

Further, in addition, an under-voltage detection may be provided. In this case, an additional comparator may be used to detect that the analog input voltage falls below a second predetermined value.

The predetermined values, for example, may be stored in digital form in respective registers, and respective digital-to-analog converters (DACs) may be used to convert the respective digital numerical values into analog signals to be compared, as mentioned, by the above comparators to the input voltage.

However, when a microcontroller or microprocessor system comprises both one or several over and/or under-voltage-detectors, and one or several analog-to-digital converters, in total, a relatively high number of elements (comparators, DACs, etc.) to build these devices are necessary.

FIG. 1 shows a schematic structure of an exemplifying electronic system 1, in particular a microcontroller or microprocessor system, in which a signal converter 2 according to an embodiment of the invention may be employed. The signal converter 2 as illustrated in FIG. 1 may, e.g., be provided on a corresponding microcontroller or microprocessor 3, or alternatively on a separate chip. The microcontroller or microprocessor 3 may comprise one or a plurality of processors 8, e.g., respective Central Processing Units (CPUs), that are connected with one or a plurality of memories, e.g., a program memory 7 and a data memory 6.

The program and data memories 6, 7 may, in the present embodiment for example, be provided on one and the same chip as the corresponding microcontroller or microprocessor 3, or may alternatively be provided on a separate chip. The program memory 7 may, e.g., comprise the sequence of instructions to be processed by the Central Processing Unit(s) (CPU(s)) 8, i.e., the program and possibly, for example, additionally corresponding data constants to be used by the Central Processing Unit(s) (CPU(s)) 8.

Contrary to this, the data memory 6 may, e.g., comprise respective variables (e.g., variables that are to be modified by the Central Processing Unit(s) (CPU(s)) 8 during the execution of the program). The data memory 6 may, e.g., be formed by one or several RAMs (RAM=Random Access Memory), in particular, e.g., DRAMs (DRAM=Dynamic Random Access Memory), or SRAMs (SRAM=Static Random Access Memory).

Further, an appropriate, non-volatile memory device, e.g., an EPROM (Erasable Programmable Read-Only Memory) or EEPROM (Electrically Erasable PROM), in particular, e.g., a flash EEPROM, may be used as program memory 7. Alternatively, a RAM, in particular, e.g., a DRAM, may also be used as program memory 7. The microcontroller or microprocessor 3 may, via one or a plurality of bus systems 4, be connected to one or a plurality of further system modules connected to the bus system(s) 4.

The microcontroller or microprocessor system 1 illustrated in FIG. 1 may, for instance, be used in a motor vehicle, e.g., for controlling distributed electrical systems (e.g., for controlling one or several batteries, for controlling direct current motors and/or stepper motors for electric window lifts and side mirrors, for adjusting the lower-beam headlamp, for managing sensor information to control the air conditioning system and/or the seating position, etc.). The microcontroller or microprocessor 3 may, for instance, be an 8-bit, 16-bit, or 32-bit microcontroller, or any other microcontroller or microprocessor or DSP.

As will be described in further detail below, by means of the signal converter 2, an analog input signal, e.g., a corresponding measurement voltage transmitted, for instance, via an analog signal line 5, and originating, e.g., from one of the above-mentioned system modules, may be converted to a digital numerical value that is "understandable" for the microcontroller or microprocessor 3 or its CPU 8, respectively. For this purpose, as will be described in further detail below, by use of the signal converter 2, a successive approximation analog-to-digital conversion (ADC) is carried out. In addition, as also will be described in further detail below, concurrently, by use of the signal converter 2, an over- and/or under-voltage detection is performed.

Figure 2:
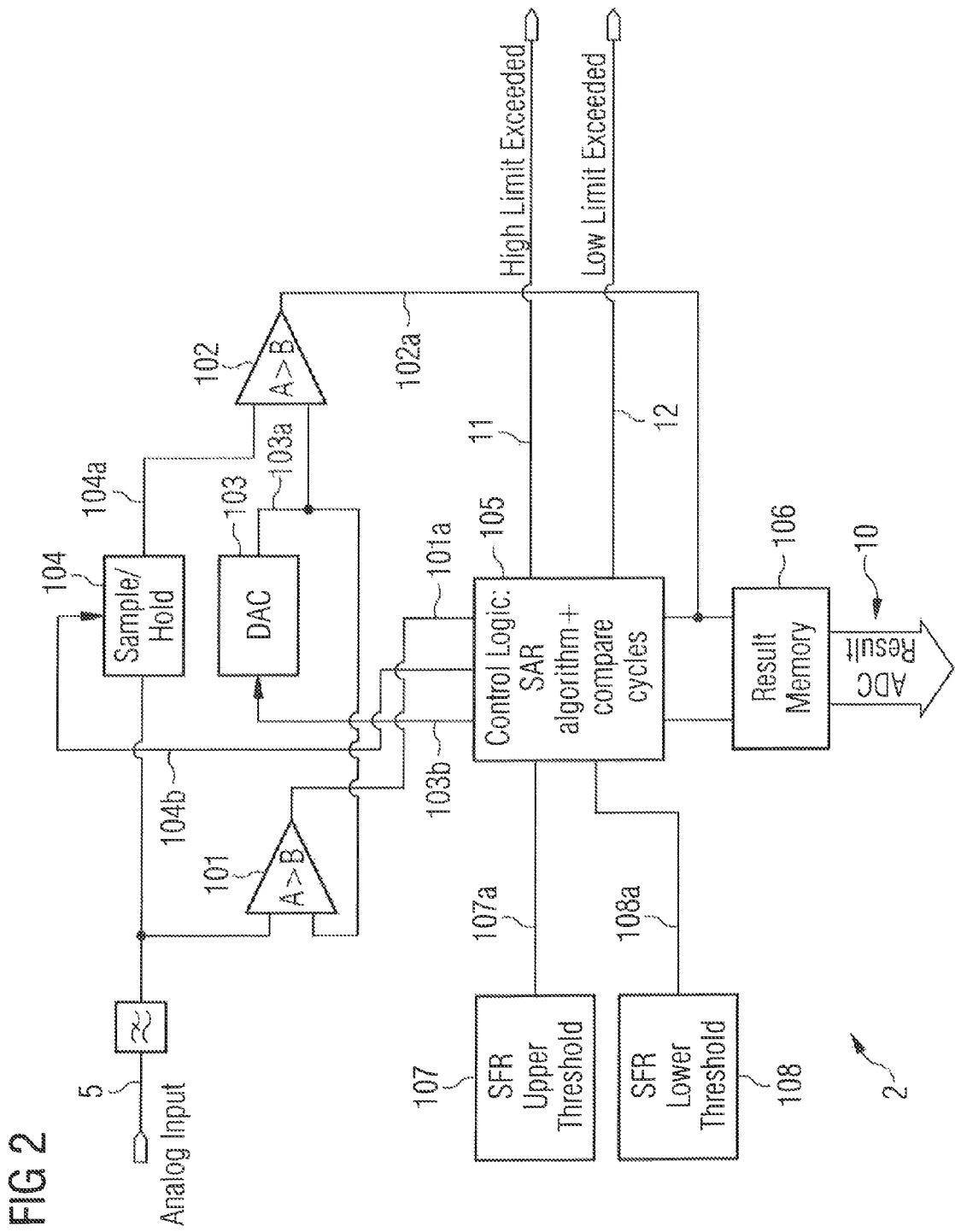
FIG. 2 schematically depicts an example of a signal converter according to an embodiment of the invention.

As is shown in FIG. 2, the signal converter 2 comprises a first comparator 101, a second comparator 102, a digital-to-analog converter (DAC) 103, and a sample-and-hold circuit 104. Further, the signal converter 2 comprises control logic 105, an ADC result memory 106, an upper threshold value storage 107, and a lower threshold value storage 108.

As is shown in FIG. 2, the analog input signal, e.g., a corresponding measurement voltage is transmitted via the analog signal line 5 to the sample-and-hold circuit 104. By use of the sample-and-hold circuit 104, the voltage of the analog input signal present at the analog signal line 5, which may continuously vary, is sampled at predetermined points of time (sample times), and a corresponding constant, locked output voltage is output at a sample-and-hold circuit output signal line 104a for a specified period of time, i.e., until the next sample time.

As is further shown in FIG. 2, a digital numerical value defining an upper threshold voltage to be monitored by the signal converter 2, and stored in the upper threshold value storage 107, is provided to the control logic 105 via respective signals lines 107a. Correspondingly similar, a digital numerical value defining a lower threshold voltage to be monitored by the signal converter 2, and stored in the lower threshold value storage 108, is provided to the control logic 105 via respective signals lines 108a.

Figure 3:
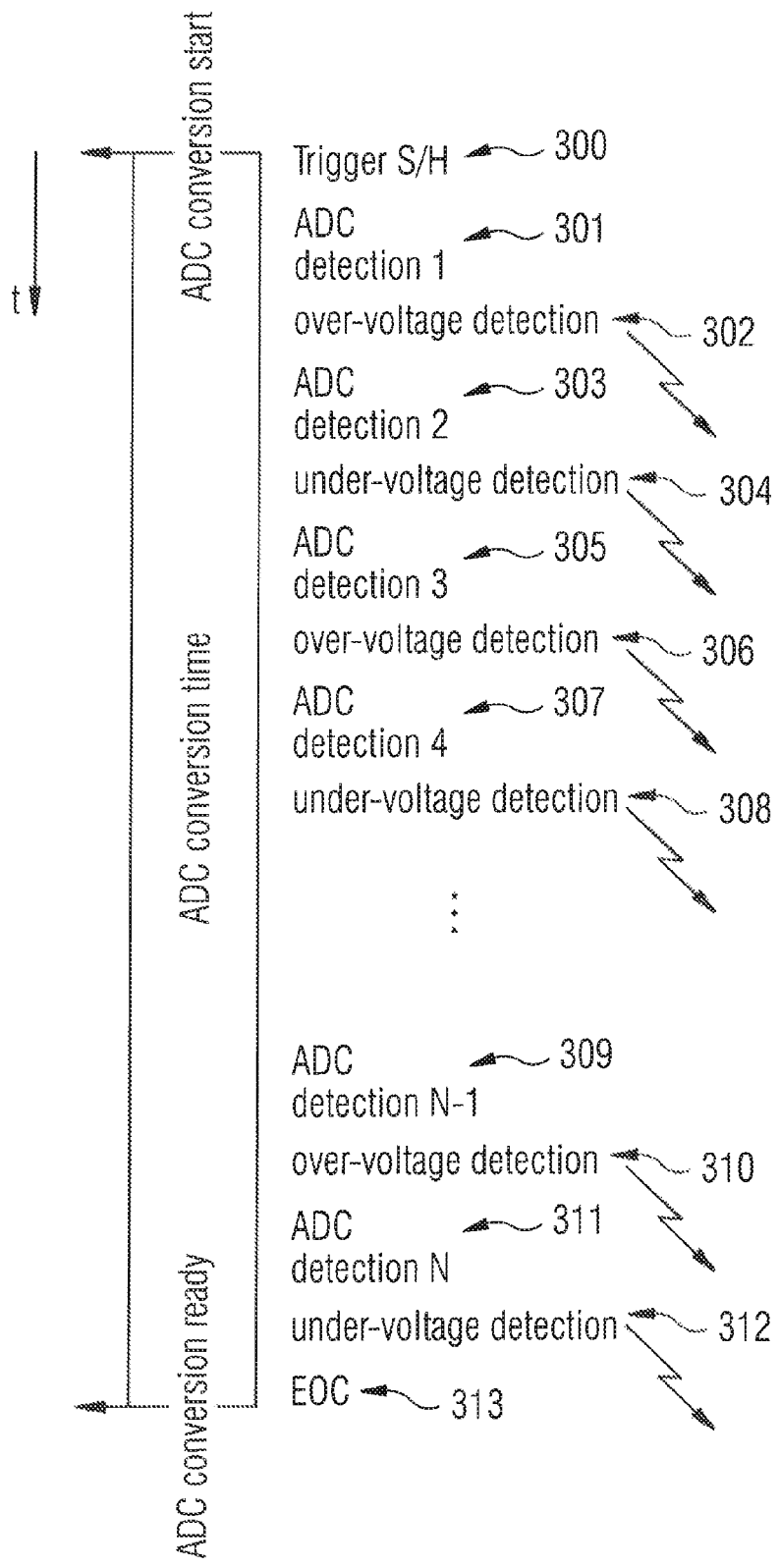
FIG. 3 schematically depicts an example of a succession of over- and under-voltage detections, and detections for an analog-to-digital conversion (ADC) carried out according to an embodiment of the invention.

As is shown in FIG. 3, at the start 300 of the analog-to-digital conversion, the control logic 105 triggers the sample-and-hold circuit 104, e.g., by applying a respective control signal at a sample-and-hold circuit control line 104b.

Then, as is shown in FIG. 2, by use of the second comparator 102, the respective constant, locked analog voltage output at the sample-and-hold circuit output signal line 104a is compared to an analog voltage provided at an output signal line 103a of the digital-to-analog converter (DAC) 103. The analog voltage at the output signal line 103a of the digital-to-analog converter (DAC) 103 at the start 300 of the analog-to-digital conversion corresponds to the midpoint of the measuring range of the signal converter 2. For instance, if the measuring range is 0-16V, the midpoint is 8V.

As is shown in FIG. 2, a digital numerical value defining the above midpoint is provided to the DAC 103 by the control logic 105 via respective signal lines 103b, and is converted by the DAC 103 into the respective analog voltage compared, as mentioned, by the second comparator 102 to the analog voltage output at the sample-and-hold circuit output signal line 104a.

The result of the comparison, e.g., a digital numerical value indicating whether the analog voltage output at the sample-and-hold circuit output signal line 104a is smaller than the analog voltage provided by the DAC 103 at its output signal line 103a, or is higher than the analog voltage provided by the DAC 103 at its output signal line 103a, is transmitted via a respective signal line 102a to the control logic 105, and the result memory 106, and is stored therein (see also FIG. 3, "ADC detection 1").

If the second comparator 102 detects 301 that the analog voltage output at the sample-and-hold circuit output signal line 104a is smaller than the analog voltage provided by the DAC 103 at its output signal line 103a, e.g., is smaller than the midpoint of 8 V, the above range is narrowed to 0-8 V. Instead, if the second comparator 102 detects 301 that the analog voltage output at the sample-and-hold circuit output signal line 104a is higher than the analog voltage provided by the DAC 103 at its output signal line 103a, e.g., is higher than the midpoint of 8 V, the range is narrowed to 8-16 V.

Thereafter, as is shown in FIG. 3, an over-voltage detection 302 is performed. For this purpose, the digital numerical value defining the above upper threshold voltage is provided by the control logic 105 to the digital-to-analog converter (DAC) 103 via the signal lines 103b, and is converted by the DAC 103 into a respective analog voltage provided at the output signal line 103a of the DAC 103. As is shown in FIG. 2, this analog upper threshold voltage is compared by the first comparator 101 to the analog input voltage present at the analog signal line 5. The result of the comparison, e.g., a digital numerical value indicating whether the analog input voltage at the analog signal line 5 is smaller than the analog upper threshold voltage provided by the DAC 103 at its output signal line 103a, or is higher than the analog upper threshold voltage provided by the DAC 103 at its output signal line 103a, is transmitted via a respective signal line 101a to the control logic 105 (see also FIG. 3, "over-voltage detection" 302).

If the first comparator 101 detects 302 that the analog input voltage at the analog signal line 5 is higher than the analog upper threshold voltage provided by the DAC 103 at its output signal line 103a, e.g., is higher than 14 or 15 V, an alarm signal is generated. In this case, for instance, an over-voltage detection signal may be applied by the control logic 105 at a respective high limit exceedance detection signal line 11, indicating that the upper voltage limit was exceeded. Instead, if the first comparator 101 detects 302 that the analog input voltage at the analog signal line 5 is lower than the analog upper threshold voltage provided by the DAC 103 at its output signal line 103a, e.g., is lower than 14 or 15 V, no alarm signal is generated. Hence, in this case, no over-voltage detection signal is applied by the control logic 105 at the high limit exceedance detection signal line 11, indicating that the upper voltage limit was not exceeded. Thereafter, the successive approximation analog-to-digital conversion is continued.

For this purpose, as is shown in FIG. 2, a digital numerical value defining a midpoint of the above narrowed range is provided to the DAC 103 by the control logic 105 via the signal lines 103b. For instance, if the measuring range, as explained above, was narrowed to 0-8 V, the midpoint of the narrowed range is 4 V. In contrast, if the measuring range was narrowed to 8-16 V, the midpoint of the narrowed range is 12 V. The digital numerical value defining the midpoint of the narrowed range is converted by the DAC 103 into a respective analog voltage output at its output signal line 103a, which is compared by the second comparator 102 to the analog voltage output at the sample-and-hold circuit output signal line 104a.

The result of the comparison, e.g., a digital numerical value indicating whether the analog voltage output at the sample-and-hold circuit output signal line 104a is smaller than the analog voltage provided by the DAC 103 at its output signal line 103a, or is higher than the analog voltage provided by the DAC 103 at its output signal line 103a, is transmitted via the signal line 102a to the control logic 105, and the result memory 106, and is stored therein (see also FIG. 3, "ADC detection 2").

For instance, in the case of a narrowed range of, e.g., 0-8 V, if the second comparator 102 detects 303 that the analog voltage output at the sample-and-hold circuit output signal line 104a is smaller than the analog voltage provided by the DAC 103 at its output signal line 103a, e.g., is smaller than the above midpoint of 4 V, the above narrowed range is further narrowed to 0-4 V. Instead, also in the case of a narrowed range of, e.g., 0-8 V, if the second comparator 102 detects 303 that the analog voltage output at the sample-and-hold circuit output signal line 104a is higher than the analog voltage provided by the DAC 103 at its output signal line 103a, e.g., is higher than the midpoint of 4 V, the above range is further narrowed to 4-8 V.

Further, in the case of a narrowed range of, e.g., 8-16 V, if the second comparator 102 detects 303 that the analog voltage output at the sample-and-hold circuit output signal line 104a is smaller than the analog voltage provided by the DAC 103 at its output signal line 103a, e.g., is smaller than the above midpoint of 12 V, the above narrowed range is further narrowed to 8-12 V. Instead, also in the case of a narrowed range of, e.g., 8-16 V, if the second comparator 102 detects 303 that the analog voltage output at the sample-and-hold circuit output signal line 104a is higher than the analog voltage provided by the DAC 103 at its output signal line 103a, e.g., is higher than the above midpoint of 12 V, the above narrowed range is further narrowed to 12-16 V.

Thereafter, as is shown in FIG. 3, an under-voltage detection 304 is performed. For this purpose, the digital numerical value defining the above lower threshold voltage is provided by the control logic 105 to the digital-to-analog converter (DAC) 103 via the signal lines 103b, and is converted by the DAC 103 into a respective analog voltage provided at the output signal line 103a of the DAC 103.

As is shown in FIG. 2, this analog lower threshold voltage is compared by the first comparator 101 to the analog input voltage present at the analog signal line 5. The result of the comparison, e.g., a digital numerical value indicating whether the analog input voltage at the analog signal line 5 is smaller than the analog lower threshold voltage provided by the DAC 103 at its output signal line 103a, or is higher than the analog lower threshold voltage provided by the DAC 103 at its output signal line 103a, is transmitted via the signal line 101a to the control logic 105 (see also FIG. 3, "under-voltage detection" 304).

If the first comparator 101 detects 304 that the analog input voltage at the analog signal line 5 is lower than the analog lower threshold voltage provided by the DAC 103 at its output signal line 103a, e.g., is lower than 1 V or 0.5 V, an alarm signal is generated. In this case, for instance, an under-voltage detection signal may be applied by the control logic 105 at a respective low limit exceedance detection signal line 12, indicating that the lower voltage limit was exceeded. Instead, if the first comparator 101 detects 304 that the analog input voltage at the analog signal line 5 is higher than the analog lower threshold voltage provided by the DAC 103 at its output signal line 103a, e.g., is higher than 1 V or 0.5 V, no alarm signal is generated. Hence, in this case, no under-voltage detection signal is applied by the control logic 105 at the low limit exceedance detection signal line 12, indicating that the lower voltage limit was not exceeded. Thereafter, the successive approximation analog-to-digital conversion is again continued.

For this purpose, as is shown in FIG. 2, a digital numerical value defining a midpoint of the above further narrowed range is provided to the DAC 103 by the control logic 105 via the signal lines 103b. For instance, if the measuring range, as explained above, was further narrowed to 0-4 V, the midpoint of the further narrowed range is 2 V. In contrast, if the measuring range was further narrowed to 4-8 V, the midpoint of the further narrowed range is 6 V. In addition, if the measuring range was further narrowed to 8-12 V, the midpoint of the further narrowed range is 10 V. Further, if the measuring range was further narrowed to 12-16 V, the midpoint of the further narrowed range is 14 V.

The digital numerical value defining the midpoint of the further narrowed range is converted by the DAC 103 into a respective analog voltage output at its output signal line 103a, which is compared by the second comparator 102 to the analog voltage output at the sample-and-hold circuit output signal line 104a. The result of the comparison, e.g., a digital numerical value indicating whether the analog voltage output at the sample-and-hold circuit output signal line 104a is smaller than the analog voltage provided by the DAC 103 at its output signal line 103a, or is higher than the analog voltage provided by the DAC 103 at its output signal line 103a, is transmitted via the signal line 102a to the control logic 105, and the result memory 106, and is stored therein (see also FIG. 3, "ADC detection 3").

For instance, in the case of a further narrowed range of, e.g., 0-4 V, if the second comparator 102 detects 305 that the analog voltage output at the sample-and-hold circuit output signal line 104a is smaller than the analog voltage provided by the DAC 103 at its output signal line 103a, e.g., is smaller than the above midpoint of 2 V, the above further narrowed range is additionally narrowed to 0-2 V. Instead, also in the case of a further narrowed range of, e.g., 0-4 V, if the second comparator 102 detects 305 that the analog voltage output at the sample-and-hold circuit output signal line 104a is higher than the analog voltage provided by the DAC 103 at its output signal line 103a, e.g., is higher than the midpoint of 2 V, the above further narrowed range is additionally narrowed to 2-4 V.

Further, in the case of a further narrowed range of, e.g., 4-8 V, if the second comparator 102 detects 305 that the analog voltage output at the sample-and-hold circuit output signal line 104a is smaller than the analog voltage provided by the DAC 103 at its output signal line 103a, e.g., is smaller than the above midpoint of 6 V, the above further narrowed range is additionally narrowed to 4-6 V. Instead, also in the case of a further narrowed range of, e.g., 4-8 V, if the second comparator 102 detects 305 that the analog voltage output at the sample-and-hold circuit output signal line 104a is higher than the analog voltage provided by the DAC 103 at its output signal line 103a, e.g., is higher than the midpoint of 6 V, the above further narrowed range is additionally narrowed to 6-8 V.

Correspondingly similar, in the case of a further narrowed range of, e.g., 8-12 V, if the second comparator 102 detects 305 that the analog voltage output at the sample-and-hold circuit output signal line 104a is smaller than the analog voltage provided by the DAC 103 at its output signal line 103a, e.g., is smaller than the above midpoint of 10 V, the above further narrowed range is additionally narrowed to 8-10 V. Instead, also in the case of a further narrowed range of, e.g., 8-12 V, if the second comparator 102 detects 305 that the analog voltage output at the sample-and-hold circuit output signal line 104a is higher than the analog voltage provided by the DAC 103 at its output signal line 103a, e.g., is higher than the midpoint of 10 V, the above further narrowed range is additionally narrowed to 10-12 V.

Still further, in the case of a further narrowed range of, e.g., 12-16 V, if the second comparator 102 detects 305 that the analog voltage output at the sample-and-hold circuit output signal line 104a is smaller than the analog voltage provided by the DAC 103 at its output signal line 103a, e.g., is smaller than the above midpoint of 14 V, the above further narrowed range is additionally narrowed to 12-14 V. Instead, also in the case of a further narrowed range of, e.g., 12-16 V, if the second comparator 102 detects 305 that the analog voltage output at the sample-and-hold circuit output signal line 104a is higher than the analog voltage provided by the DAC 103 at its output signal line 103a, e.g., is higher than the midpoint of 14 V, the above further narrowed range is additionally narrowed to 14-16 V.

Thereafter, as is shown in FIG. 3, again, an over-voltage detection 306 is performed. For this purpose, again, the digital numerical value defining the above upper threshold voltage is provided by the control logic 105 to the digital-to-analog converter (DAC) 103 via the signal lines 103b, is converted by the DAC 103 into the respective analog voltage, and is compared by the first comparator 101 to the analog input voltage present at the analog signal line 5. The result of the comparison, e.g., a digital numerical value indicating whether the analog input voltage at the analog signal line 5 is smaller than the analog upper threshold voltage provided by the DAC 103 at its output signal line 103a, or is higher than the analog upper threshold voltage provided by the DAC 103 at its output signal line 103a, is transmitted via the signal line 101a to the control logic 105 (see also FIG. 3, "over-voltage detection" 306).

If the first comparator 101 detects 306 that the analog input voltage at the analog signal line 5 is higher than the analog upper threshold voltage provided by the DAC 103 at its output signal line 103a, e.g., is higher than 14 or 15 V, an over-voltage detection signal may be applied by the control logic 105 at the high limit exceedance detection signal line 11. Instead, if the first comparator 101 detects 306 that the analog input voltage at the analog signal line 5 is lower than the analog upper threshold voltage provided by the DAC 103 at its output signal line 103a, e.g., is lower than 14 or 15 V, no over-voltage detection signal is applied by the control logic 105 at the high limit exceedance detection signal line 11.

Thereafter, the successive approximation analog-to-digital conversion is further continued. For this purpose, as is shown in FIG. 2, a digital numerical value defining a midpoint of the above additionally narrowed range is provided to the DAC 103 by the control logic 105 via the signal lines 103b. For instance, if the measuring range was additionally narrowed to 0-2 V, the midpoint of the additionally narrowed range is 1 V, if the measuring range was additionally narrowed to 2-4 V, the midpoint of the additionally narrowed range is 3 V, if the measuring range was additionally narrowed to 4-6 V, the midpoint of the additionally narrowed range is 5 V, and if the measuring range was additionally narrowed to 6-8 V, the midpoint of the additionally narrowed range is 7 V.

Further, if the measuring range was additionally narrowed to 8-10 V, the midpoint of the additionally narrowed range is 9 V, if the measuring range was additionally narrowed to 10-12 V, the midpoint of the additionally narrowed range is 11 V, if the measuring range was additionally narrowed to 12-14 V, the midpoint of the additionally narrowed range is 13 V, and if the measuring range was additionally narrowed to 14-16 V, the midpoint of the additionally narrowed range is 15 V. The digital numerical value defining the midpoint of the additionally narrowed range is converted by the DAC 103 into a respective analog voltage output at its output signal line 103a, which is compared by the second comparator 102 to the analog voltage output at the sample-and-hold circuit output signal line 104a.

The result of the comparison, e.g., a digital numerical value indicating whether the analog voltage output at the sample-and-hold circuit output signal line 104a is smaller than the analog voltage provided by the DAC 103 at its output signal line 103a, or is higher than the analog voltage provided by the DAC 103 at its output signal line 103a, is transmitted via the signal line 102a to the control logic 105, and the result memory 106, and is stored therein (see also FIG. 3, "ADC detection 4"). For instance, in the case of an additionally narrowed range of, e.g., 0-2 V, if the second comparator 102 detects 307 that the analog voltage output at the sample-and-hold circuit output signal line 104a is smaller than the analog voltage provided by the DAC 103 at its output signal line 103a, e.g., is smaller than the above midpoint of 1 V, the above additionally narrowed range is even further narrowed to 0-1 V.

Instead, also in the case of an additionally narrowed range of, e.g., 0-2 V, if the second comparator 102 detects 307 that the analog voltage output at the sample-and-hold circuit output signal line 104a is higher than the analog voltage provided by the DAC 103 at its output signal line 103a, e.g., is higher than the midpoint of 1 V, the above additionally narrowed range is even further narrowed to 1-2 V, and so forth.

Hence, as a result of the above comparison, it is detected whether the analog voltage output at the sample-and-hold circuit output signal line 104a lies in the above even further narrowed range of 0-1 V, or 1-2 V, or 2-3 V, or 3-4 V, or 4-5 V, or 5-6 V, or 6-7 V, or 7-8 V, or 8-9 V, or 9-10 V, or 10-11 V, or 11-12 V, or 12-13 V, or 13-14 V, or 14-15 V, or 15-16 V, respectively.

Thereafter, again, as is shown in FIG. 3, an under-voltage detection 308 is performed, correspondingly similar as described with respect to the under-voltage detection 304 above.

Then, the successive approximation analog-to-digital conversion is further continued, where, correspondingly similar as described with respect to the detections 301, 303, 305, 307 above, it is detected 309, by use of the second comparator 102, whether the analog voltage output at the sample-and-hold circuit output signal line 104a is smaller, or is higher than the midpoint of the respective above even further narrowed range (e.g., is smaller, or higher than 0.5 V, 1.5 V, 2.5 V, 3.5 V, 4.5 V, 5.5 V, 6.5 V, 7.5 V, 8.5 V, 9.5 V, 10.5 V, 11.5 V, 12.5 V, 13.5 V, 14.5 V or 15.5 V, respectively). Depending on the result of this comparison performed by the second comparator 102, correspondingly similar as described above, the even further narrowed range is additionally narrowed to, e.g., 0-0.5 V, 0.5-1 V, 1-1.5 V or 1.5-2 V, and so forth.

Then, again, as is shown in FIG. 3, an over-voltage detection 310 is performed, correspondingly similar as described with respect to the over-voltage detections 302, 306 above.

Thereafter, the successive approximation analog-to-digital conversion is further continued where, correspondingly similar as described with respect to the detections 301, 303, 305, 307, 309 above, it is detected 311, by use of the second comparator 102, whether the analog voltage output at the sample-and-hold circuit output signal line 104a is smaller, or is higher than the midpoint of the respective above additionally narrowed range (e.g., is smaller, or higher than 0.25 V, 0.75 V or 1.25 V, etc.).

Then, again, as is shown in FIG. 3, an under-voltage detection 312 may be performed, correspondingly similar as described with respect to the under-voltage detections 304, 308 above, followed, optionally, and if desired, by a further corresponding continuation of the above successive approximation analog-to-digital conversion, until the desired resolution of the analog-to-digital conversion is reached (see FIG. 3, end of conversion, EOC 313).

As becomes clear from the description above, only one single digital-to-analog converter 103 is necessary to carry out, by the signal converter 2, both a successive approximation analog-to-digital conversion, and, in addition, respective over- and/or under-voltage detections.

Thereby, as is clear also, the succession of the above over- and/or under-voltage detections 302, 304, 306, 308, 310, 312, as well as the detections 301, 303, 305, 307, 309, 311 for the analog-to-digital conversion carried out by the signal converter 2, or a correspondingly similar signal converter, may be varied in many ways.

Figure 4:
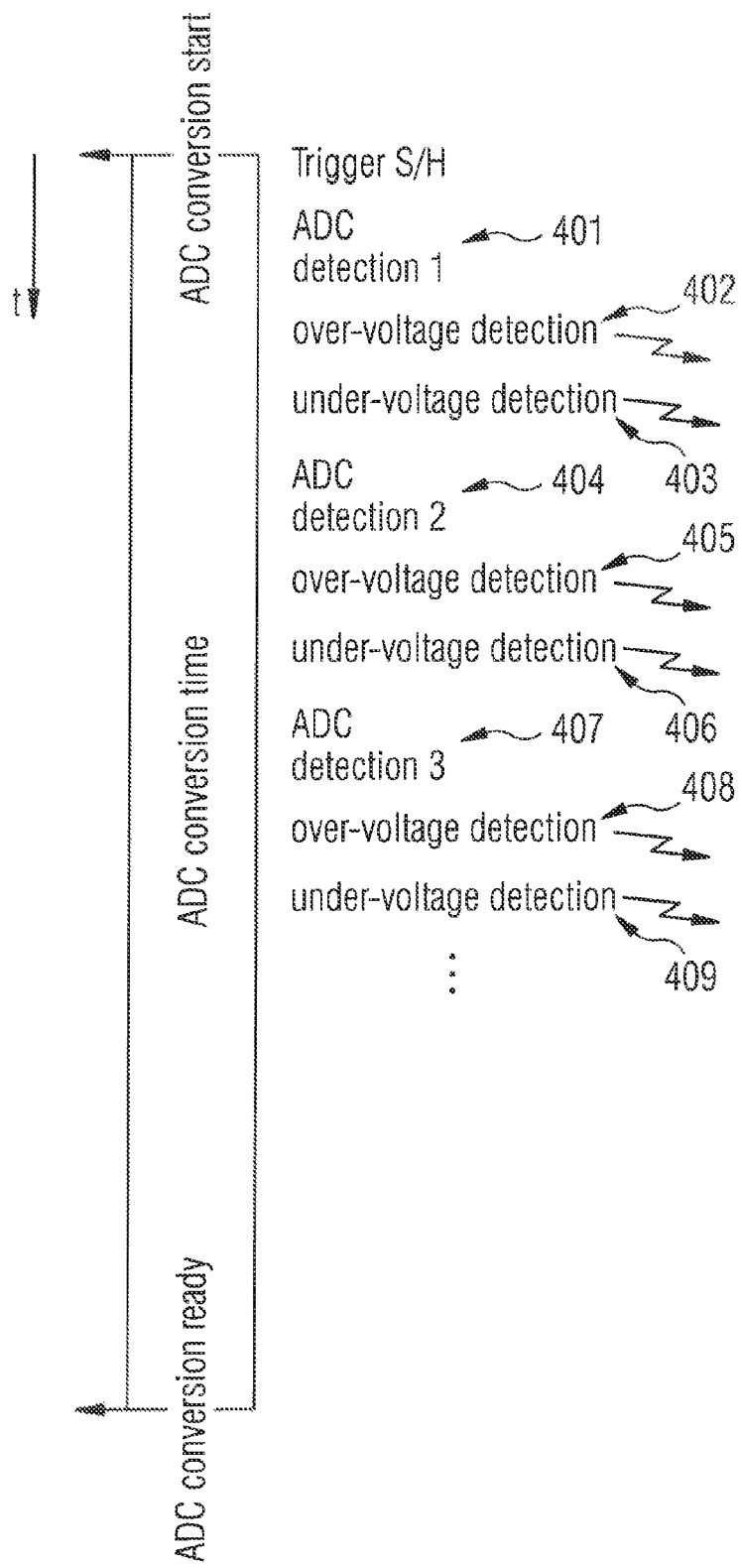
FIG. 4 schematically depicts an alternative example of a succession of over- and under-voltage detections, and detections for an analog-to-digital conversion (ADC) carried out according to an alternative embodiment of the invention.

For instance, as is shown in FIG. 4, first for a successive approximation analog-to-digital conversion, correspondingly similar as described with respect to the detection 301 shown in FIG. 3, it may be detected 401 whether the analog voltage output at the sample-and-hold circuit output signal line 104a is smaller, or is higher than the midpoint, e.g., 8 V, of the respective (initial) measuring range (e.g., 0-16 V). Depending on the result of this detection, correspondingly similar as described above, the (initial) measuring range is narrowed to, e.g., 0-8 V or 8-16 V, respectively.

Then, as is shown in FIG. 4, an over-voltage detection 402 may be performed, correspondingly similar as described with respect to the over-voltage detection 302 shown in FIG. 3. Subsequently, as also shown in FIG. 4, an under-voltage detection 403 may be performed, correspondingly similar as described with respect to the under-voltage detection 304 shown in FIG. 3.

Thereafter, the successive approximation analog-to-digital conversion may be continued, where, correspondingly similar as described with respect to the detection 303 shown in FIG. 3, it may be detected 404 whether the analog voltage output at the sample-and-hold circuit output signal line 104a is smaller, or is higher than the midpoint, e.g., 4 V or 12 V, of the above narrowed range (e.g., 0-8 V or 8-16 V, respectively).

Depending on the result of this detection, correspondingly similar as described above, the narrowed range is further narrowed to, e.g., 0-4 V, 4-8 V, 8-12 V or 12-16 V, respectively. Thereafter, as is shown in FIG. 4, again, an over-voltage detection 405 may be performed, correspondingly similar as described with respect to the over-voltage detection 306 shown in FIG. 3.

Subsequently, as also shown in FIG. 4, again, an under-voltage detection 406 may be performed, correspondingly similar as described with respect to the under-voltage detection 308 shown in FIG. 3.

Then, the successive approximation analog-to-digital conversion may be continued, where, correspondingly similar as described with respect to the detection 305 shown in FIG. 3, it may be detected 407 whether the analog voltage output at the sample-and-hold circuit output signal line 104*a* is smaller, or is higher than the midpoint, e.g., 2 V, of the above further narrowed range (e.g., 0-4 V, 4-8 V, 8-12 V or 12-16 V, respectively). Depending on the result of this detection, correspondingly similar as described above, the further narrowed range is even further narrowed to, e.g., 0-2 V, 2-4 V, 4-6 V, 6-8 V, 8-10 V, 10-12 V, 12-14 V or 14-16 V, respectively.

As is shown in FIG. 4, then, again, an over-voltage detection 408 may be performed, correspondingly similar as described with respect to the over-voltage detections shown in FIG. 3. Subsequently, as also shown in FIG. 4, again, an under-voltage detection 409 may be performed, correspondingly similar as described with respect to the under-voltage detections shown in FIG. 3.

The above succession of over- and/or under-voltage detections, and detections for the analog-to-digital conversion (ADC) may be continued until the desired ADC resolution is reached.

Figure 5:
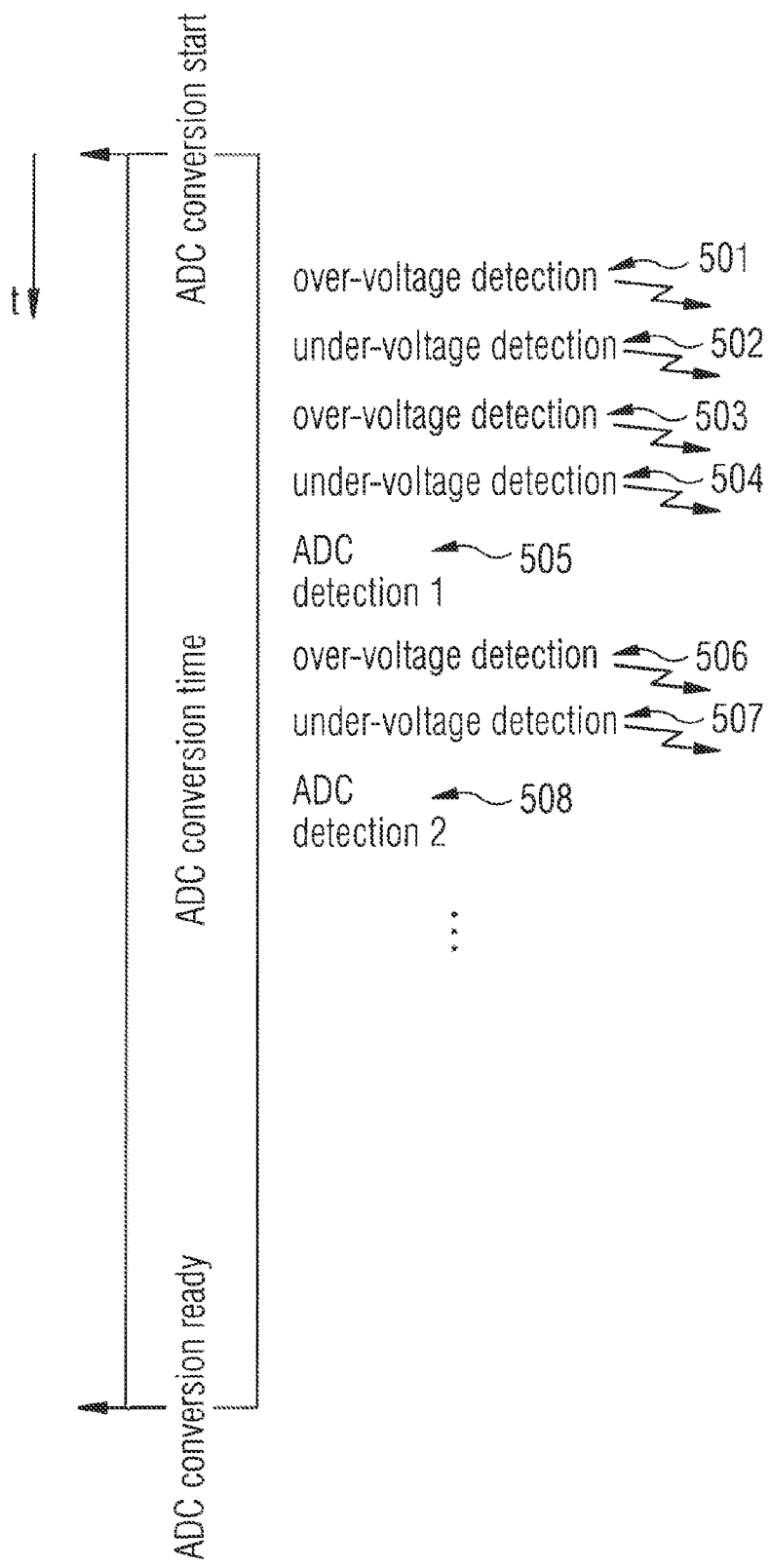
FIG. 5 schematically depicts a further alternative example of a succession of over- and under-voltage detections, and detections for an analog-to-digital conversion (ADC) carried out according to a further alternative embodiment of the invention.

In a further variant of the succession of over- and/or under-voltage detections, and detections for an analog-to-digital conversion (ADC), as is shown in FIG. 5, first, an over-voltage detection 501 may be performed, correspondingly similar as described with respect to the over-voltage detection 302 shown in FIG. 3.

Subsequently, as shown in FIG. 5, an under-voltage detection 502 may be performed, correspondingly similar as described with respect to the under-voltage detection 304 shown in FIG. 3. Thereafter, again, an over-voltage detection 503 may be performed, correspondingly similar as described with respect to the over-voltage detection 306 shown in FIG. 3.

Subsequently, as shown in FIG. 5, again, an under-voltage detection 504 may be performed, correspondingly similar as described with respect to the under-voltage detection 308 shown in FIG. 3. This succession of over- and/or under-voltage detections may be continued till the start of an analog-to-digital conversion is triggered.

In return, as shown in FIG. 5, correspondingly similar as described with respect to the detection 301 shown in FIG. 3, it may be detected 505 whether the analog voltage output at the sample-and-hold circuit output signal line 104*a* is smaller, or is higher than the midpoint, e.g., 8 V, of the respective initial measuring range (e.g., 0-16 V), such as to narrow the initial measuring range to, e.g., 0-8 V or 8-16 V, respectively.

Then, as is shown in FIG. 5, again, an over-voltage detection 506 may be performed, correspondingly similar as described with respect to the over-voltage detections shown in FIG. 3. Subsequently, as also shown in FIG. 5, again, an under-voltage detection 507 may be performed, correspondingly similar as described with respect to the under-voltage detections shown in FIG. 3.

Thereafter, the successive approximation analog-to-digital conversion may be continued, where, correspondingly similar as described with respect to the detection 303 shown in FIG. 3, it may be detected 508 whether the analog voltage output at the sample-and-hold circuit output signal line 104*a* is smaller, or is higher than the midpoint, e.g., 4 V or 12 V, of the above narrowed range (e.g., 0-8 V or 8-16 V, respectively).

Depending on the result of this detection, correspondingly similar as described above, the narrowed range is further narrowed to, e.g., 0-4 V, 4-8 V, 8-12 V or 12-16 V, respectively. Thereafter, again, an over-voltage detection may be performed, followed by a further under-voltage detection.

Then, again, the successive approximation analog-to-digital conversion may be continued, and so forth, until the desired ADC resolution is reached.

Hence, correspondingly similar as described above e.g. with respect to FIGS. 2 and 3, only one single digital-to-analog converter 103 is necessary to carry out, by the signal converter 2, both a successive approximation analog-to-digital conversion, and, in addition, an over- and/or under-voltage detection.

Figure 6:
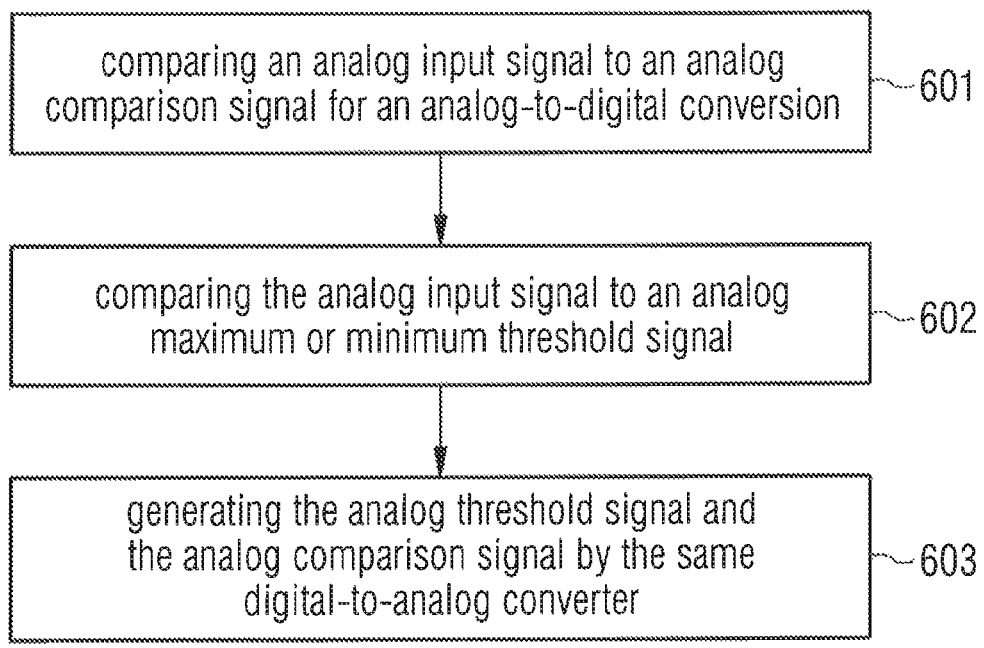
FIG. 6 schematically depicts a method for operating a signal converter according to an embodiment of the invention.

In a further embodiment of the invention, as shown in FIG. 6, an analog-to-digital conversion of an analog input signal is carried out, comprising comparing 601 the analog input signal to an analog comparison signal. Further, it is detected whether the analog input signal exceeds a predetermined maximum or minimum threshold, comprising comparing 602 the analog input signal to an analog threshold signal. Thereby, the analog comparison signal for the analog-to-digital conversion and the analog threshold signal for the detection of whether the analog input signal exceeds a predetermined maximum or minimum threshold are generated 603 by one-and-the same digital-to-analog converter.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for operating a signal converter, comprising:
converting an analog input signal to a digital output signal, comprising, during a first period, comparing the analog input signal to an analog comparison signal; and
detecting whether the analog input signal exceeds a predetermined maximum or minimum threshold, comprising comparing, during a second period subsequent to the first period, the analog input signal to an analog threshold signal, wherein the analog comparison signal and the analog threshold signal are generated by a same digital-to-analog converter.

2. The method of claim 1, comprising:
comparing the analog input signal to the analog comparison signal by a first comparator; and
comparing the analog input signal to the analog threshold signal by a second comparator different from the first comparator.

3. The method of claim 2, comprising:
providing, by use of a sample-and-hold circuit, the analog input signal to the first comparator; and
providing, without the use of a sample-and-hold circuit, the analog input signal to the second comparator.

4. The method of claim 1, wherein converting the analog input signal to the digital output signal further comprises comparing the analog input signal to a further analog comparison signal, wherein the analog comparison signal, the analog threshold signal, and the further analog comparison signal are generated by the same digital-to-analog converter.

5. The method of claim 4, comprising:
comparing the analog input signal to the analog comparison signal and to the further analog comparison signal by a first comparator; and
comparing the analog input signal to the analog threshold signal by a second comparator different from the first comparator.

6. The method of claim 4, wherein converting the analog input signal to the digital output signal comprises performing a successive approximation analog-to-digital conversion.

7. The method of claim 6, wherein the analog comparison signal corresponds to a midpoint of a first range of the successive approximation analog-to-digital conversion, and the further analog comparison signal corresponds to a midpoint of a second range of the successive approximation analog-to-digital conversion, wherein the second range is more narrow than the first range.

8. The method of claim 1, additionally comprising detecting whether the analog input signal is below a further predetermined threshold, comprising comparing the analog input signal to a further analog threshold signal, wherein the analog comparison signal and the analog threshold signal and the further analog threshold signal are generated by the same digital-to-analog converter.

9. The method of claim 8, comprising:
comparing the analog input signal to the analog comparison signal by a first comparator; and
comparing the analog input signal to the analog threshold signal and the further analog threshold signal by a second comparator different from the first comparator.

10. The method of claim 1, comprising:
providing a digital comparison value to the digital-to-analog converter;
converting, by the digital-to-analog converter, the digital comparison value into the analog comparison signal;
providing a digital threshold value to the digital-to-analog converter; and
converting, by the digital-to-analog converter, the digital threshold value into the analog threshold signal, wherein the digital comparison value and the digital threshold value are generated by a same control logic.

11. The method of claim 1, comprising generating an alarm signal when it is detected that the analog input signal exceeds the predetermined maximum or minimum threshold.

12. The method of claim 1, comprising comparing the analog input signal to the analog comparison signal and comparing the analog input signal to the analog threshold signal by a same comparator.

13. A signal converter, comprising:
one or more comparators configured to compare during a first period an analog input signal to an analog comparison signal for an analog-to-digital conversion of the analog input signal, wherein the one or more comparators are further configured to compare during a second period subsequent to the first period the analog input signal to an analog threshold signal to detect whether the analog input signal exceeds a predetermined maximum or minimum threshold; and
a digital-to-analog converter configured to generate the analog comparison signal and the analog threshold signal.

14. The signal converter of claim 13, wherein the one or more comparators comprises:
a first comparator configured to compare the analog input signal to the analog comparison signal; and
a second comparator different from the first comparator configured to compare the analog input signal to the analog threshold signal.

15. The signal converter of claim 13, wherein the one or more comparators comprises a comparator configured to compare the analog input signal to the analog comparison signal and to compare the analog input signal to the analog threshold signal.

16. The signal converter of claim 13, wherein:
the digital-to-analog converter is configured to generate the analog comparison signal in response to a digital comparison value;
the digital-to-analog converter is configured to generate the analog threshold signal in response to a digital threshold value; and
the signal converter further comprises a control logic configured to generate both the digital comparison value and the digital threshold value.

17. The signal converter of claim 16, wherein the control logic is further configured to generate an alarm signal when it is detected that the analog input signal exceeds the predetermined maximum or minimum threshold.

18. An electronic device, comprising:
means for comparing an analog input signal to an analog comparison signal for an analog-to-digital conversion of the analog input signal during a first period;
means for comparing the analog input signal to an analog threshold signal during a second period subsequent to the first period to detect whether the analog input signal exceeds a predetermined maximum or minimum threshold; and
means for generating both the analog comparison signal and the analog threshold signal.

* * * * *